US006853599B2

(12) United States Patent
Oh et al.

(10) Patent No.: US 6,853,599 B2
(45) Date of Patent: Feb. 8, 2005

(54) MAGNETIC MEMORY DEVICE IMPLEMENTING READ OPERATION TOLERANT TO BITLINE CLAMP VOLTAGE (VREF)

(75) Inventors: Hyung-rok Oh, Sungnam-shi (KR); Su-yeon Kim, Suwon-shi (KR); Woo-yeong Cho, Kyunggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/660,802

(22) Filed: Sep. 12, 2003

(65) Prior Publication Data

US 2004/0066678 A1 Apr. 8, 2004

(30) Foreign Application Priority Data

Oct. 2, 2002 (KR) .................................. 10-2002-0060252

(51) Int. Cl.[7] ................................................ G11C 7/02
(52) U.S. Cl. .................... 365/210; 365/158; 365/189.06
(58) Field of Search ......................... 365/158, 97, 210, 365/205, 189.06, 189.07

(56) References Cited

U.S. PATENT DOCUMENTS

| 6,445,612 | B1 | * | 9/2002 | Naji | ........................... 365/158 |
|---|---|---|---|---|---|
| 6,574,129 | B1 | * | 6/2003 | Tran | ........................... 365/94 |
| 6,700,814 | B1 | * | 3/2004 | Nahas et al. | ................. 365/158 |
| 2003/0123281 | A1 | * | 7/2003 | Iwata et al. | .................. 365/158 |
| 2004/0022097 | A1 | * | 2/2004 | Cho | ........................... 365/200 |

OTHER PUBLICATIONS

2002 Symposium on VLSI Circuits Digest of Technical Papers, Durlam et al.—A low power 1Mbit MRAM, etc.. pp. 158–161.

* cited by examiner

*Primary Examiner*—Gene N. Auduong
(74) *Attorney, Agent, or Firm*—Lee & Sterba, P.C.

(57) ABSTRACT

A magnetic memory device includes a memory cell array block and a reference memory cell array block having a plurality of magnetic memory cells arranged, respectively, at intersections of wordlines, digit lines, and bitlines, and reference wordlines, the digit lines, and a reference bitline, a first bitline clamp circuit coupled to a bitline to which a first selected magnetic memory cell is connected and supplying a first current to the first selected magnetic memory cell through the bitline, second and third bitline clamp circuits coupled to respective upper and lower ends of the reference bitline, for supplying a second current to selected magnetic memory cells in the reference memory cell array block through the reference bitline, and a sense amplifier for sensing and amplifying currents on first and second data lines, respectively connected to the bitline and the reference bitline, to judge data of the first selected magnetic memory cell.

10 Claims, 6 Drawing Sheets

MAGNETIC MEMORY DEVICE IMPLEMENTING READ OPERATION TOLERANT TO BITLINE CLAMP VOLTAGE (VREF)

BACKGROUND OF THE INVENTION

1. Field of the Invention

The present invention relates to a magnetic random access memory. More particularly, the present invention relates to a magnetic random access memory where a current of $(I(H)+I(L))/2$ flows to a reference cell irrespective of a bitline clamp voltage.

2. Description of the Related Art

Magnetic random access memory (MRAM) is a kind of a non-volatile memory device including a plurality of magnetic memory cells. The MRAM utilizes a magnetoresistive effect occurring between a magnetic layer and an amagnetic layer, which constitute a multiple layer (bi-layer). When magnetization directions in the magnetic layer are identical to each other (parallel state), the magnetic resistance of a magnetic memory cell is minimal. When magnetization directions in the magnetic layer are opposite to each other (anti-parallel state), the magnetic resistance of a magnetic memory cell is maximal. The parallel state is called a logic low ("L") state, and the anti-parallel state is called a logic high ("H") state.

To read a logic state stored in the magnetic memory cell, the MRAM applies a sense current and a reference current to a target cell and a reference cell, respectively. A voltage drop arises at both ends of cells according to magnetic resistance values of the target cell and the reference cell. These voltages are compared with each other to determine a state of the target cell. In order to precisely compare the target cell with the reference cell, there is a demand for a magnetic memory cell having no variation in the magnetic resistance. Generally, a current of $(I(H)+I(L))/2$ flows to the reference cell.

FIG. 1 illustrates a 32 Kb MRAM memory block with a mid-point reference generator of the prior art. The mid-point reference generator has four magnetic resistors that are connected in series-parallel. One serially connected magnetic resistor is connected in parallel with another serially connected magnetic resistor, so that it becomes a resistor having a value of (Rmax+Rmin)/2. A magnetic resistor value of the mid-point reference generator is variable with the level of a bitline clamp voltage Vref, which will be explained below with reference to FIG. 2.

Referring to FIG. 2, a difference between a maximum resistor Rmax and a minimum resistor Rmin when a bitline clamp voltage Vref is equal to a voltage having a set value is smaller than a difference between the maximum resistor Rmax and the minimum resistor Rmin when the bitline clamp voltage Vref is lower than the voltage having the set value. That is, if the bitline clamp voltage Vref is high, the resistor value "(Rmax+Rmin)/2" becomes small. If the bitline clamp voltage Vref is low, the resistor value "(Rmax+Rmin)/2" becomes large. Thus, the mid-point reference generator should regulate the reference voltage Vref to set the resistor value "(Rmax+Rmin)/2". The reference voltage Vref is regulated only by an experimental result, and requires reconstruction of the bitline clamp voltage of a reference cell. As a result, a read operation of the magnetic memory cell becomes unstable.

SUMMARY OF THE INVENTION

The present invention provides an MRAM, which is able to perform a stable read operation irrespective of a level of fluctuation of a bitline clamp voltage.

In accordance with an embodiment of the present invention, there is provided a magnetic memory device including a memory cell array block having a plurality of magnetic memory cells arranged at intersections of wordlines, digit lines, and bitlines; a reference memory cell array block having a plurality of magnetic memory cells arranged at intersections of reference wordlines, the digit lines, and a reference bitline, wherein one wordline is arranged at two respective adjacent wordlines; a first bitline clamp circuit for making a predetermined first current flow to a selected magnetic memory cell in the memory cell array block through a bitline to which the selected magnetic memory cell in the memory cell array block is connected, according to data of the selected magnetic memory cell in the memory cell array block, the first bitline clamp circuit being coupled to the bitline; second and third bitline clamp circuits for making a predetermined second current flow to selected magnetic memory cells in the reference memory cell array block through the reference bitline, the second and third bitline clamp circuits being coupled to an upper end and a lower end of the reference bitline, respectively; and a sense amplifier for sensing and amplifying a third current on a first data line connected to the bitline and a fourth current on a second data line connected to the reference bitline to judge the data of the selected magnetic memory cell in the memory cell array block.

In accordance with a second embodiment of the present invention, there is provided a magnetic memory device including a memory cell array block having a plurality of magnetic memory cells arranged at intersections of wordlines, digit lines, and bitlines; a reference memory cell array block having a plurality of magnetic memory cells arranged at intersections of reference wordlines, the digit lines, and a reference bitline, wherein two magnetic memory cells are arranged at either side of the reference bitline; a first bitline clamp circuit for making predetermined first current flow to a selected magnetic memory cell in the memory cell array block through a bitline to which the selected magnetic memory cell in the memory cell array block is connected, according to data of the selected magnetic memory cell in the memory cell array block, the first bitline clamp circuit being coupled to the bitline; second and third bitline clamp circuits for making a predetermined second current flow to selected magnetic memory cells in the reference memory cell array block through the reference bitline, the second and third bitline clamp circuits being coupled to an upper end and a lower end of the reference bitline, respectively; and a sense amplifier for sensing and amplifying a third current on a first data line connected to the bitline and a fourth current on a second data line connected to the reference bitline to judge the data of the selected magnetic memory cell in the memory cell array block.

In both of the magnetic memory devices above, the first bitline clamp circuit is preferably identical to the second and third bitline clamp circuits. Preferably, each of the first to third bitline clamp circuits compares a level of a voltage of the bitline or the reference bitline with a level of a bitline clamp voltage, to make the level of the voltage of the bitline or the reference bitline rise up to the level of the bitline clamp voltage.

The reference memory cell array block preferably has high level "H" data and low level "L" data, which are stored in two magnetic memory cells coupled to the reference wordline, respectively. The magnetic memory devices may further include first, second, and third current supply units for supplying respective constant currents to the reference bitline, the data line, and the reference data line, respectively.

DETAILED DESCRIPTION OF THE INVENTION

An MRAM according to a first embodiment of the present invention will now be described with reference to FIG. 3.

Figure 1:
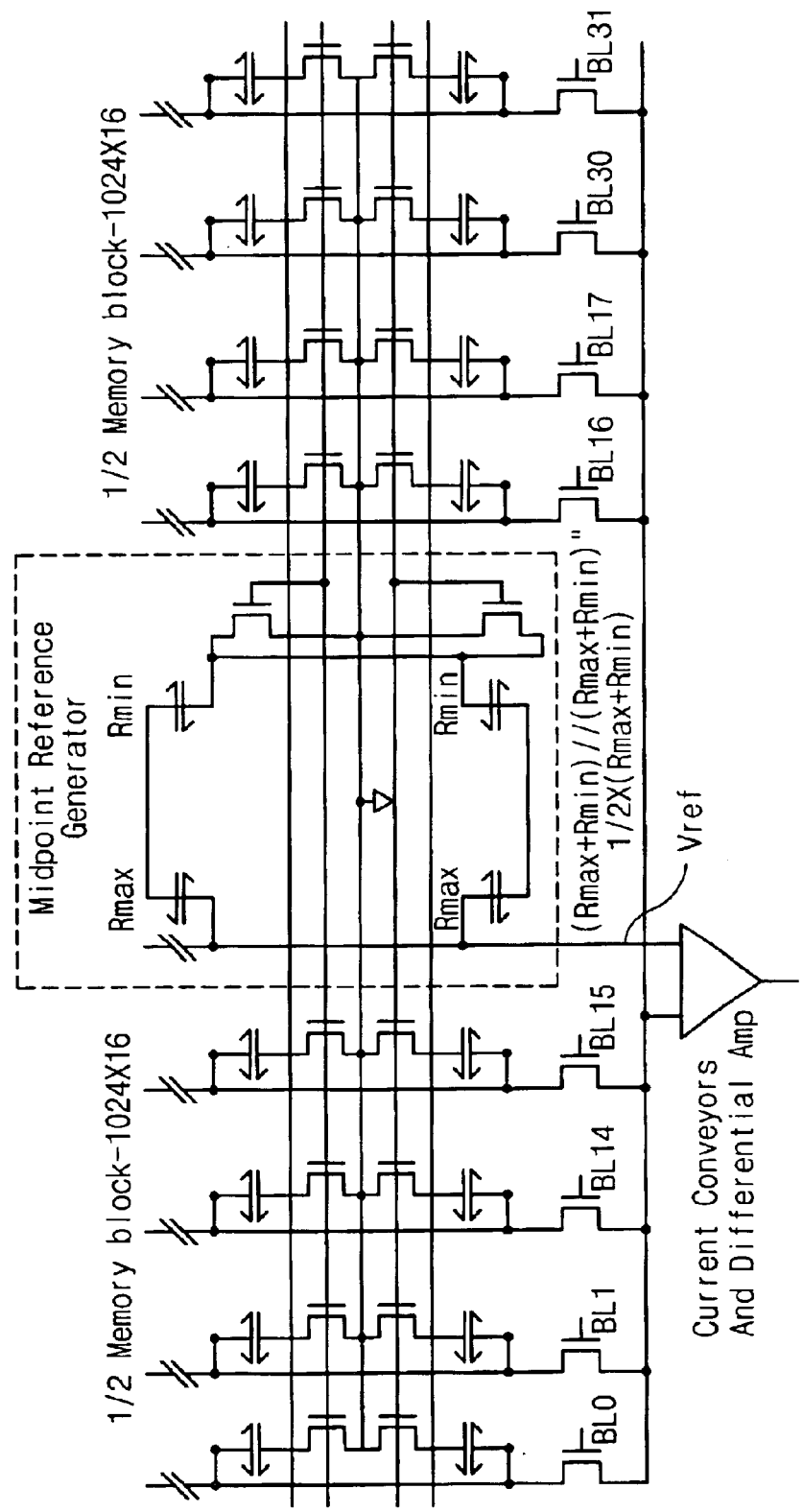
FIG. 1 illustrates a 32 Kb MRAM memory block with a mid-point reference generator of the prior art.
Figure 2:
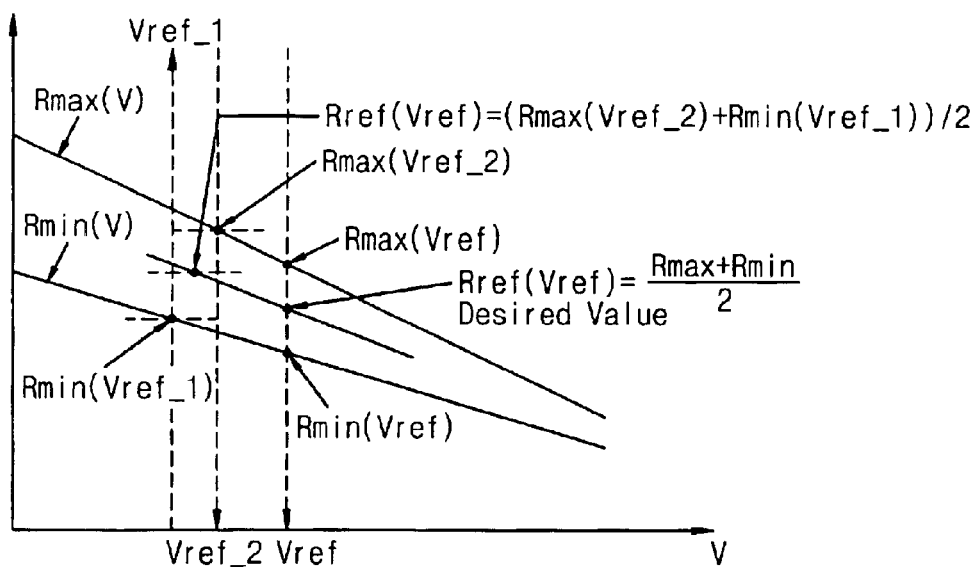
FIG. 2 is a graph showing magnetic resistor variation based on fluctuation of a bitline clamp voltage (Vref) of the MRAM shown in FIG. 1.
Figure 3:
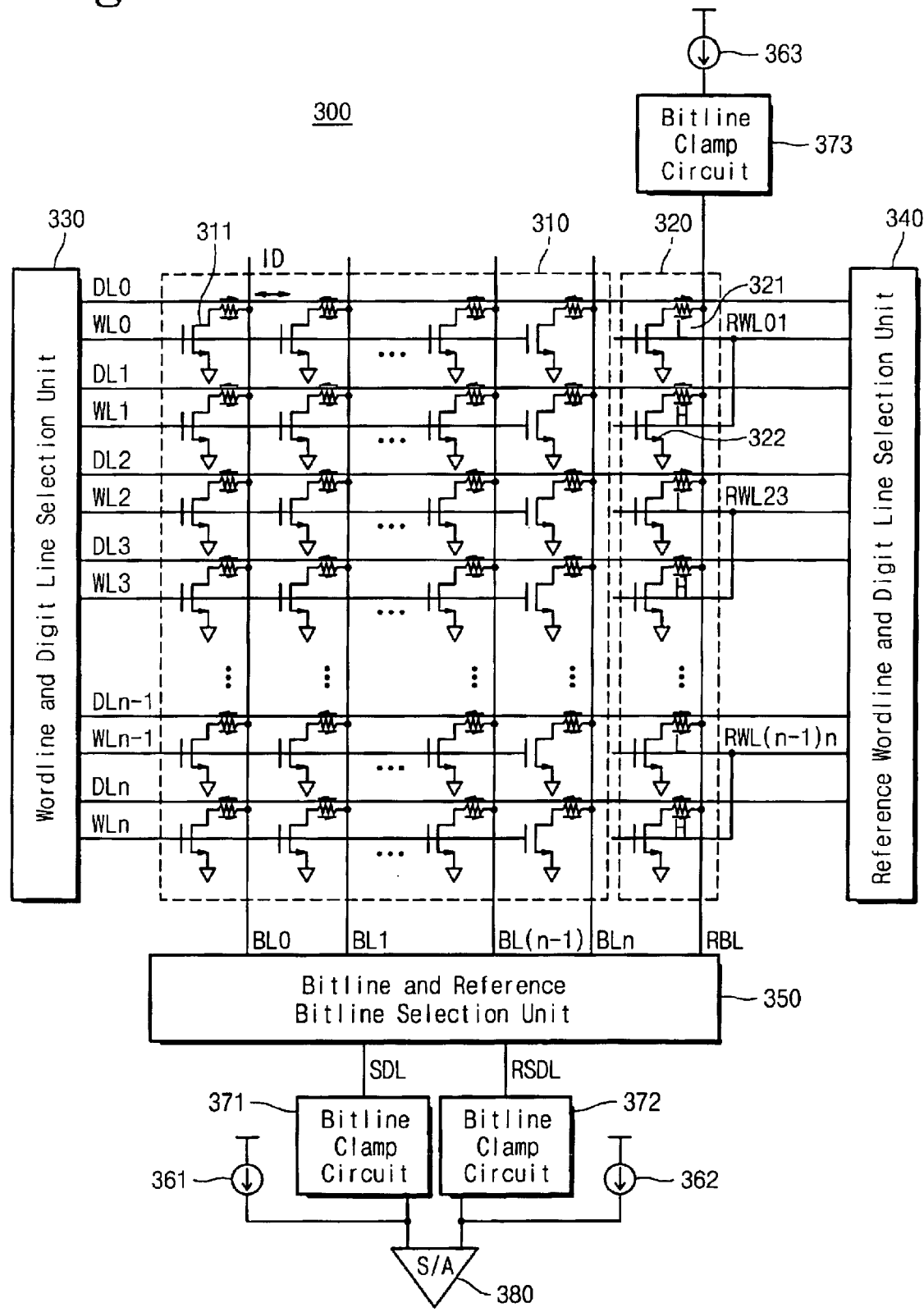
FIG. 3 is a diagram of an MRAM according to a first embodiment of the present invention.

Referring to FIG. 3, an MRAM 310 includes a memory array block 310, a reference memory array block 320, a wordline and digit line selection unit 330, a reference wordline and digit line selection unit 340, a bitline and a reference bitline selection unit 350, reference current supply units 361, 362, and 363, bitline clamp circuits 371, 372, and 373, and a sense amplifier (S/A) 380. The memory array block 310 has magnetic memory cells arranged at intersections of wordlines WL0, WL1, . . . , WLn−1, WLn (referred to in totality as WL), bitlines BL0, BL1, . . . , BLn−1, BLn (referred to in totality as BL), and digit lines DL0, DL1, . . . , and DLn−1, and DLn (referred to in totality as DL). The reference memory array block 320 has magnetic memory cells arranged at intersections of reference wordlines RWL01, RWL23, . . . , RWL(n−1)n (referred to in totality as RWL), a reference bitline RBL, and the digit lines DL. Two magnetic memory cells 321 and 322 coupled to the first reference wordline RWL01 store a logic "H" state and a logic "L" state, respectively.

The wordline and digit line selection unit 330 selects one of the wordlines WL and one of the digit lines DL to determine a direction of a digit current ID. The bitline and reference bitline selection unit 350 selects one of the bitlines BL and the reference bitline RBL to connect a data line SDL with a reference data line RSDL. The first to third current supply units 361, 362, and 363 supply respective constant currents to the data line SDL, the reference data line RSDL, and the reference bitline RBL, respectively. The first to third bitline clamp circuits 371, 372, and 373 have the same construction. The first to third bitline clamp circuits 371, 372, and 373 allow a voltage of the data line DSL and the reference data line RSDL, which are precharged to a ground voltage (VSS; not shown) before enabling the wordlines WL, to rise up to the level of the bitline clamp voltage (VREF; not shown). According to the data value of the selected magnetic memory cell, current i(H) or i(L) flows to the data line DSL and current (i(H)+i(L))/2 flows to the reference data line RSDL. The sense amplifier 380 senses and amplifies the current flowing to the data line SDL and the current flowing to the reference data line RSDL to judge a logic state of the selected magnetic memory cell.

An operation of reading magnetic memory cell data from the MRAM of FIG. 3 will now be described with reference to FIG. 4.

Figure 4:
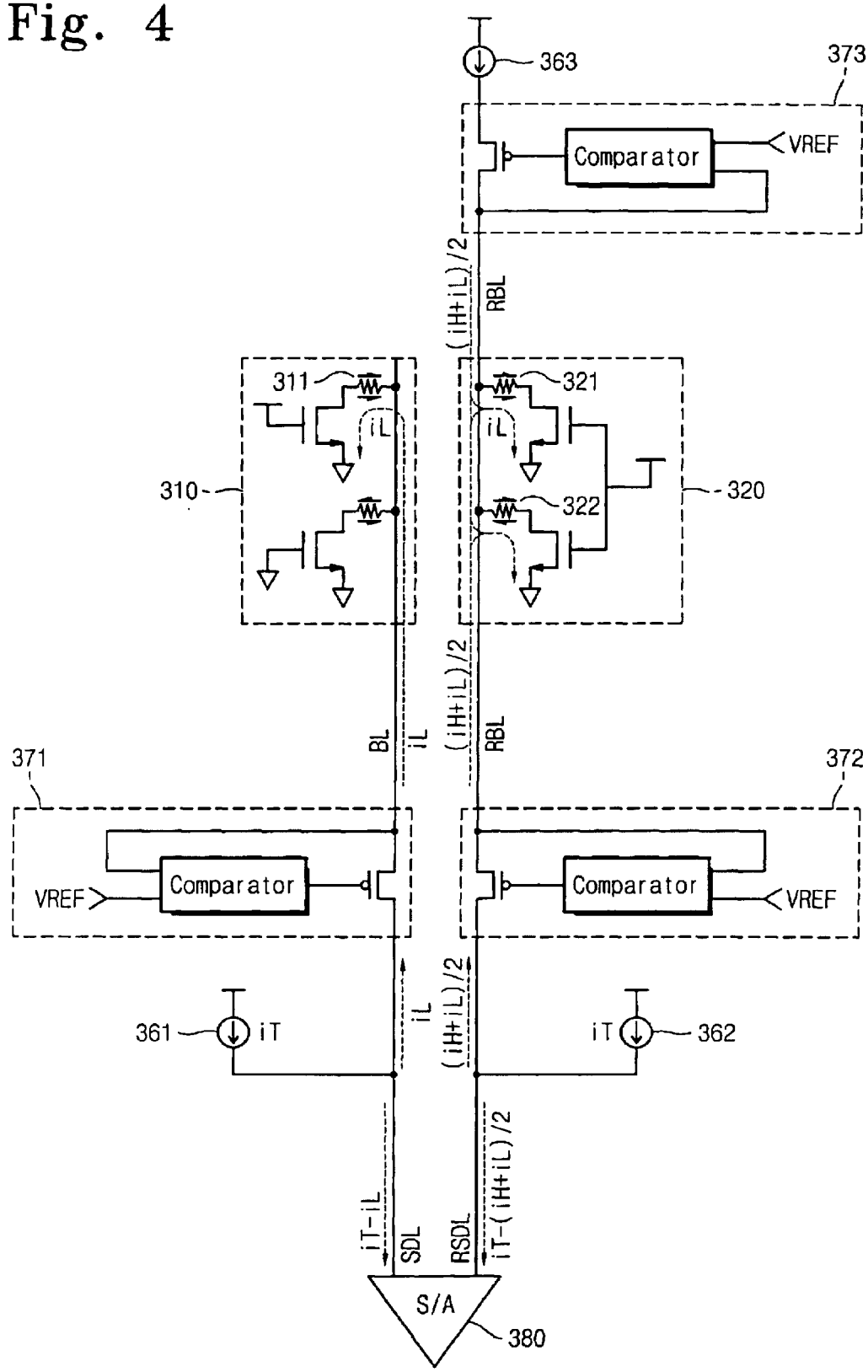
FIG. 4 is a circuit diagram for explaining a read operation of the MRAM shown in FIG. 4.

Referring to FIG. 4, in a case that data of a selected magnetic memory cell 311 in the memory array block 310 is "L", the current i(L) flows to the magnetic memory cell 311. In a first bitline clamp circuit 371, the current i(L) is supplied to the bitline BL to which the selected magnetic memory cell 311 is connected. The currents i(H) and i(L) flow to the selected magnetic memory cells 321 and 322 in the reference memory array block 320. Current (i(H)+i(L))/2 is supplied from the respective second and third clamp circuits 372 and 373 that are connected to the reference bitline line RBL, allowing current (i(H)+i(L)) to flow to the reference bitline RBL. Current iT−i(L), which is a difference between current iT supplied from the first current supply unit 361 and current i(L) of the bitline BL, flows to the data line SDL coupled to the bitline BL. Current iT−((i(H)+i(L)/2), which is a difference between current iT supplied from the second current supply unit 362 and current (i(H)+i(L))/2 of the reference bitline RBL, flows to the reference data line RSDL coupled to the reference bitline RBL. The sense amplifier senses and amplifies a current difference between the data line SDL and the reference data line RSDL, i.e., a current difference (i(H)−i(L))/2, to judge data of the selected magnetic memory cell 311.

The MRAM 300 uses the same bitline clamp circuits 371, 372, and 373 that are connected to the bitline BL and the reference bitline RBL, thereby preventing a magnetic resistor variation due to fluctuation of a bitline clamp voltage VREF level. Removal of variation in the magnetic resistor results in a stable read operation. Further, an operating time of the sense amplifier 380 may be freely controlled by regulating the bitline clamp voltage VREF.

An MRAM according to a second embodiment of the present invention will now be described with reference to FIG. 5.

Figure 5:
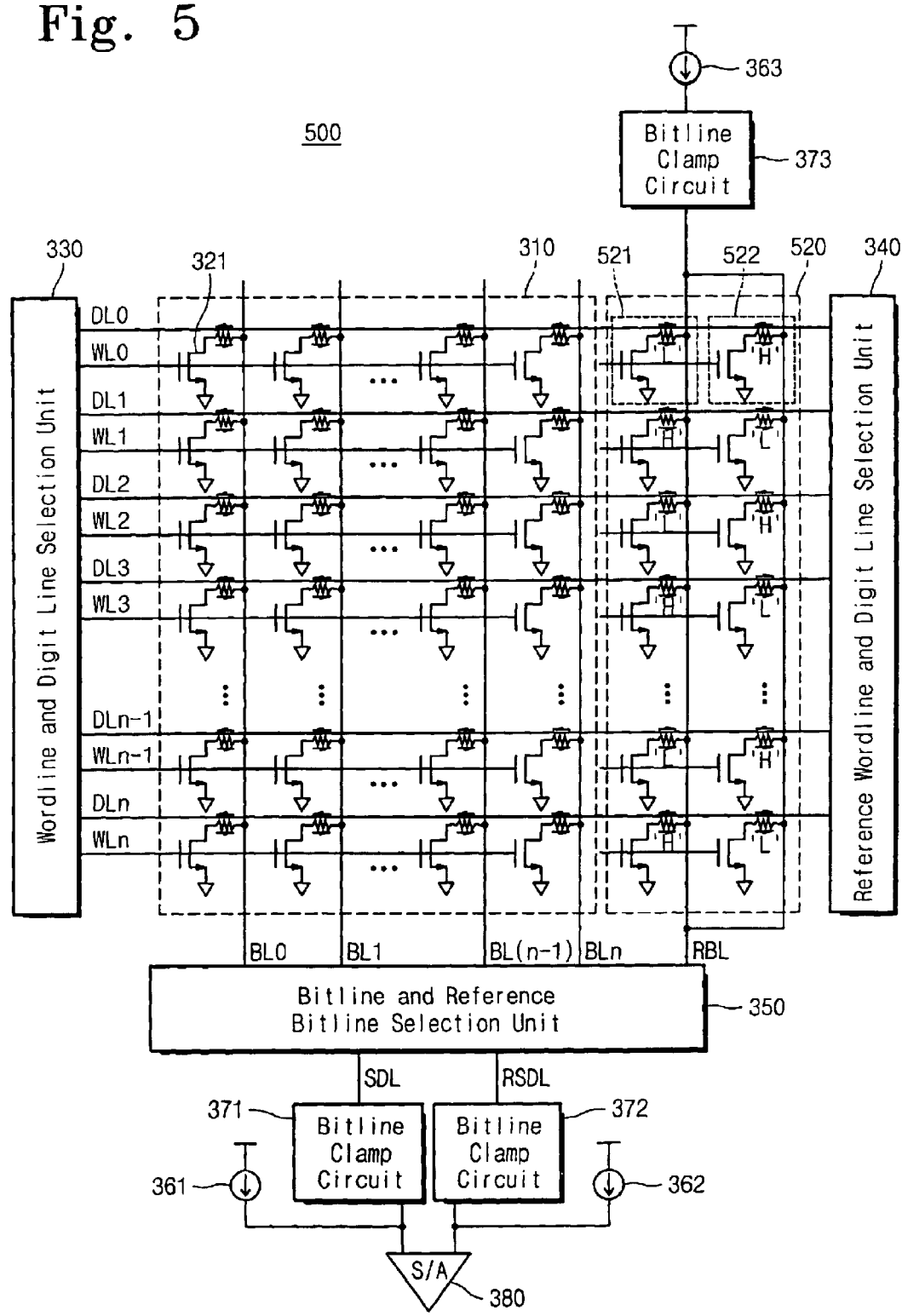
FIG. 5 is a diagram of an MRAM according to a second embodiment of the present invention.

Referring to FIG. 5, an MRAM 500 is substantially identical to the MRAM 300 of FIG. 3, except that a reference memory cell array block 520 is different from the reference memory cell array block 320 of FIG. 3. Elements of FIG. 5 that are the same in FIG. 3 will not be described in further detail. Referring to FIG. 5, the reference memory cell array block 520 has magnetic memory cells disposed at intersections of wordlines WL, digit lines DL, and a reference bitline RBL. Two magnetic cells 521 and 522, coupled to one wordline WL and one digit line DL, are coupled to the reference wordline RBL. Low level "L" data is stored in one magnetic memory cell 521, and high level "H" data is stored in the other magnetic memory cell 522.

A read operation of magnetic memory cell data in the MRAM 500 of FIG. 5 will now be described with reference to FIG. 6.

Figure 6:
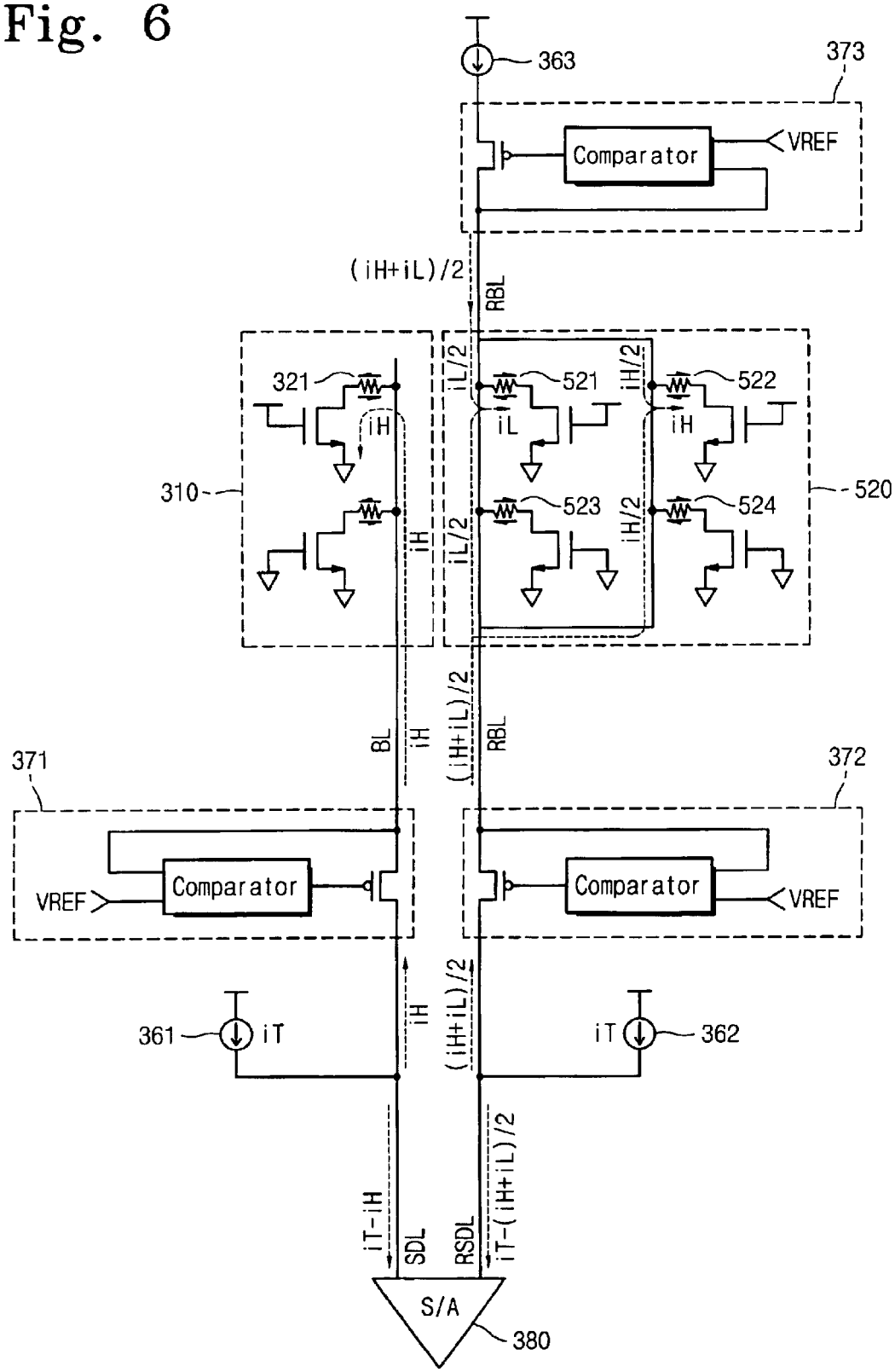
FIG. 6 is a circuit diagram for explaining a read operation of the MRAM shown in FIG. 5.

Referring to FIG. 6, in a case that data of the selected magnetic memory cell 311 in the memory array block 310 is "H", current i(H) flows to the selected magnetic memory cell 311. In a first bitline clamp circuit 371, current i(H) flows to the bitline BL to which the selected magnetic memory cell 311 is connected. At this time, current (i(H)+i(L))/2 is supplied from a second clamp circuit 372 and a third clamp circuit 373, which are connected to the reference bitline RBL, enabling current i(H)+i(L) to flow to the reference bitline RBL. The current i(H)+i(L) of the reference bitline RBL become currents i(H) and i(L) of the magnetic memory cells 521 and 522. Current iT−i(H), which is a difference between current iT supplied from a first current supply unit 361 and current i(H) of the bitline BL, flows to a data line SDL coupled to the bitline BL. Current iT−((i(H)+i(L))/2), which is a difference between current iT supplied from a second current supply unit 362 and current (i(H)+i(L))/2 of the reference bitline RBL, flows to a reference data line RSDL coupled to the reference bitline RBL. A sense amplifier (S/A) 380 senses and amplifies a current difference of the data line SDL and the reference data line RSDL, i.e., (i(L)−i(H))/2, to judge the data of the selected magnetic memory cell 311.

The MRAM of the present invention allows a stable read operation to be performed, regardless of a level of fluctuation of a bitline clamp voltage, by preventing a magnetic resistor variation due to the fluctuation of the bitline clamp voltage. Also, by the MRAM of the present invention, an operating time of the sense amplifier 380 may be freely controlled by regulating the bitline clamp voltage VREF.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A magnetic memory device, comprising:
    a memory cell array block having a plurality of magnetic memory cells arranged at intersections of wordlines, digit lines, and bitlines;
    a reference memory cell array block having a plurality of magnetic memory cells arranged at intersections of reference wordlines, the digit lines, and a reference bitline, wherein one wordline is arranged at respective two adjacent wordlines;
    a first bitline clamp circuit for making a predetermined first current flow to a selected magnetic memory cell in the memory cell array block through a bitline to which the selected magnetic memory cell in the memory cell array block is connected, according to data of the selected magnetic memory cell in the memory cell array block, the first bitline clamp circuit being coupled to the bitline;
    second and third bitline clamp circuits for making a predetermined second current flow to selected magnetic memory cells in the reference memory cell array block through the reference bitline, the second and third bitline clamp circuits being coupled to an upper end and a lower end of the reference bitline, respectively; and
    a sense amplifier for sensing and amplifying a third current on a first data line connected to the bitline and a fourth current on a second data line connected to the reference bitline to judge the data of the selected magnetic memory cell in the memory cell array block.

2. The magnetic memory device as claimed in claim 1, wherein the first bitline clamp circuit is identical to the second and third bitline clamp circuits.

3. The magnetic memory device as claimed in claim 2, wherein the first bitline clamp circuit compares a level of a voltage of the bit line with a level of a bitline clamp circuits to make the voltage of the bit line rise up to the level of the bitline clamp voltage; and wherein each of the second and third bitline clamp circuits compares a level of a voltage of the reference bitline with the level of the bitline clamp voltage to make the level of the voltage of the reference bitline rise up to the level of the bitline clamp voltage.

4. The magnetic memory device as claimed in claim 1, wherein the reference memory cell array block has high level "H" data and low level "L" data, which are stored in two magnetic memory cells coupled to the reference wordline, respectively.

5. The magnetic memory device as claimed in claim 1, further comprising first, second, and third current supply units for supplying respective constant currents to the reference bitline, the data line, and the reference data line, respectively.

6. A magnetic memory device, comprising:
    a memory cell array block having a plurality of magnetic memory cells arranged at intersections of wordlines, digit lines, and bitlines;
    a reference memory cell array block having a plurality of magnetic memory cells arranged at intersections of reference wordlines, the digit lines, and a reference bitline, wherein two magnetic memory cells are arranged at either side of the reference bitline;
    a first bitline clamp circuit for making predetermined first current flow to a selected magnetic memory cell in the memory cell array block through a bitline to which the selected magnetic memory cell in the memory cell array block is connected, according to data of the selected magnetic memory cell in the memory cell array block, the first bitline clamp circuit being coupled to the bitline;
    second and third bitline clamp circuits for making a predetermined second current flow to selected magnetic memory cells in the reference memory cell array block through the reference bitline, the second and third bitline clamp circuits being coupled to an upper end and a lower end of the reference bitline, respectively; and
    a sense amplifier for sensing and amplifying a third current on a first data line connected to the bitline and a fourth current on a second data line connected to the reference bitline to judge the data of the selected magnetic memory cell in the memory cell array block.

7. The magnetic memory device as claimed in claim 6, wherein the first bitline clamp circuit is identical to the second and third bitline clamp circuits.

8. The magnetic memory device as claimed in claim 7, wherein the first bitline clamp circuit compares a level of a voltage of the bit line with a level of a bitline clamp circuits to make the voltage of the bit line rise up to the level of the bitline clamp voltage; and wherein each of the second and third bitline clamp circuits compares a level of a voltage of the reference bitline with the level of the bitline clamp voltage to make the level of the voltage of the reference bitline rise up to the level of the bitline clamp voltage.

9. The magnetic memory device as claimed in claim 6, wherein the reference memory cell array block has high level "H" data and low level "L" data, which are stored in two magnetic memory cells coupled to the reference wordline, respectively.

10. The magnetic memory device as claimed in claim 6, further comprising first, second, and third current supply units for supplying respective constant currents to the reference bitline, the data line, and the reference data line, respectively.

* * * * *